United States Patent
Lin et al.

(10) Patent No.: US 12,501,639 B2
(45) Date of Patent: *Dec. 16, 2025

(54) RINSE PROCESS AFTER FORMING FIN-SHAPED STRUCTURE

(71) Applicant: UNITED MICROELECTRONICS CORP., Hsin-Chu (TW)

(72) Inventors: Po-Chang Lin, Tainan (TW); Bo-Han Huang, Chiayi County (TW); Chih-Chung Chen, Tainan (TW); Chun-Hsien Lin, Tainan (TW); Shih-Hung Tsai, Tainan (TW); Po-Kuang Hsieh, Kaohsiung (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 385 days.

This patent is subject to a terminal disclaimer.

(21) Appl. No.: 18/213,903

(22) Filed: Jun. 26, 2023

(65) Prior Publication Data

US 2023/0335622 A1     Oct. 19, 2023

Related U.S. Application Data

(63) Continuation of application No. 17/090,902, filed on Nov. 6, 2020, now Pat. No. 11,735,646, which is a
(Continued)

(30) Foreign Application Priority Data

Oct. 31, 2018  (CN) .......................... 201811286627.2

(51) Int. Cl.
 *H10D 30/01*  (2025.01)
 *H01L 21/02*  (2006.01)
 *H10D 30/62*  (2025.01)

(52) U.S. Cl.
 CPC ....... *H10D 30/024* (2025.01); *H01L 21/0206* (2013.01); *H01L 21/02238* (2013.01);
(Continued)

(58) Field of Classification Search
 CPC .......... H10D 30/0245; H10D 30/6212; H10D 30/6213; H10D 62/292; H01L 21/02252
 See application file for complete search history.

(56) References Cited

U.S. PATENT DOCUMENTS 8,415,254 B2   4/2013  Yeh et al.
10,868,148 B2  12/2020 Lin
(Continued)

FOREIGN PATENT DOCUMENTS

CN   105448717 A   3/2016
TW   201835982 A   10/2018
(Continued)

*Primary Examiner* — Yu Chen
(74) *Attorney, Agent, or Firm* — Winston Hsu

(57) ABSTRACT

A method for fabricating semiconductor device includes the steps of: forming fin-shaped structures on a substrate; using isopropyl alcohol (IPA) to perform a rinse process; performing a baking process; and forming a gate oxide layer on the fin-shaped structures. Preferably, a duration of the rinse process is between 15 seconds to 60 seconds, a temperature of the baking process is between 50° C. to 100° C., and a duration of the baking process is between 5 seconds to 120 seconds.

13 Claims, 3 Drawing Sheets

Related U.S. Application Data continuation of application No. 16/209,890, filed on Dec. 4, 2018, now Pat. No. 10,868,148.

(52) U.S. Cl.
CPC ... *H01L 21/02252* (2013.01); *H10D 30/0245* (2025.01); *H10D 30/6211* (2025.01); *H10D 30/6213* (2025.01)

(56) References Cited

U.S. PATENT DOCUMENTS

| | | | |
|---|---|---|---|
| 2008/0054361 A1 | 3/2008 | Siprak | |
| 2010/0093179 A1* | 4/2010 | Hori | H01L 21/31116 438/723 |
| 2012/0306969 A1 | 12/2012 | Kodoi | |
| 2013/0015534 A1 | 1/2013 | Cheng | |
| 2015/0270123 A1 | 9/2015 | Arata | |
| 2015/0380241 A1 | 12/2015 | Yu | |
| 2016/0013041 A1 | 1/2016 | Liu | |
| 2018/0040614 A1* | 2/2018 | Chang | H10D 84/0151 |
| 2018/0366348 A1 | 12/2018 | Cho | |
| 2020/0098639 A1* | 3/2020 | Seshadri | H01L 21/02181 |
| 2020/0119003 A1 | 4/2020 | Mistkawi | |

FOREIGN PATENT DOCUMENTS

| | | |
|---|---|---|
| WO | 01/00338 | 1/2001 |
| WO | 2018/063277 A1 | 4/2018 |

* cited by examiner

RINSE PROCESS AFTER FORMING FIN-SHAPED STRUCTURE

CROSS REFERENCE TO RELATED APPLICATIONS

This application is a continuation application of U.S. application Ser. No. 17/090,902, filed on Nov. 6, 2020, which is a continuation application of U.S. application Ser. No. 16/209,890, filed on Dec. 4, 2018. The contents of these applications are incorporated herein by reference.

BACKGROUND OF THE INVENTION

1. Field of the Invention

The invention relates to a method for fabricating semiconductor device, and more particularly, to a method of conducting a rinse process after forming fin-shaped structures.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

However, the design of fin-shaped structure in current FinFET fabrication still resides numerous bottlenecks which induces current leakage of the device and affects overall performance of the device. Hence, how to improve the current FinFET fabrication and structure has become an important task in this field.

SUMMARY OF THE INVENTION

According to an embodiment of the present invention, a method for fabricating semiconductor device includes the steps of: forming fin-shaped structures on a substrate; using isopropyl alcohol (IPA) to perform a rinse process; performing a baking process; and forming a gate oxide layer on the fin-shaped structures. Preferably, a duration of the rinse process is between 15 seconds to 60 seconds, a temperature of the baking process is between 50° C. to 100° C., and a duration of the baking process is between 5 seconds to 120 seconds.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
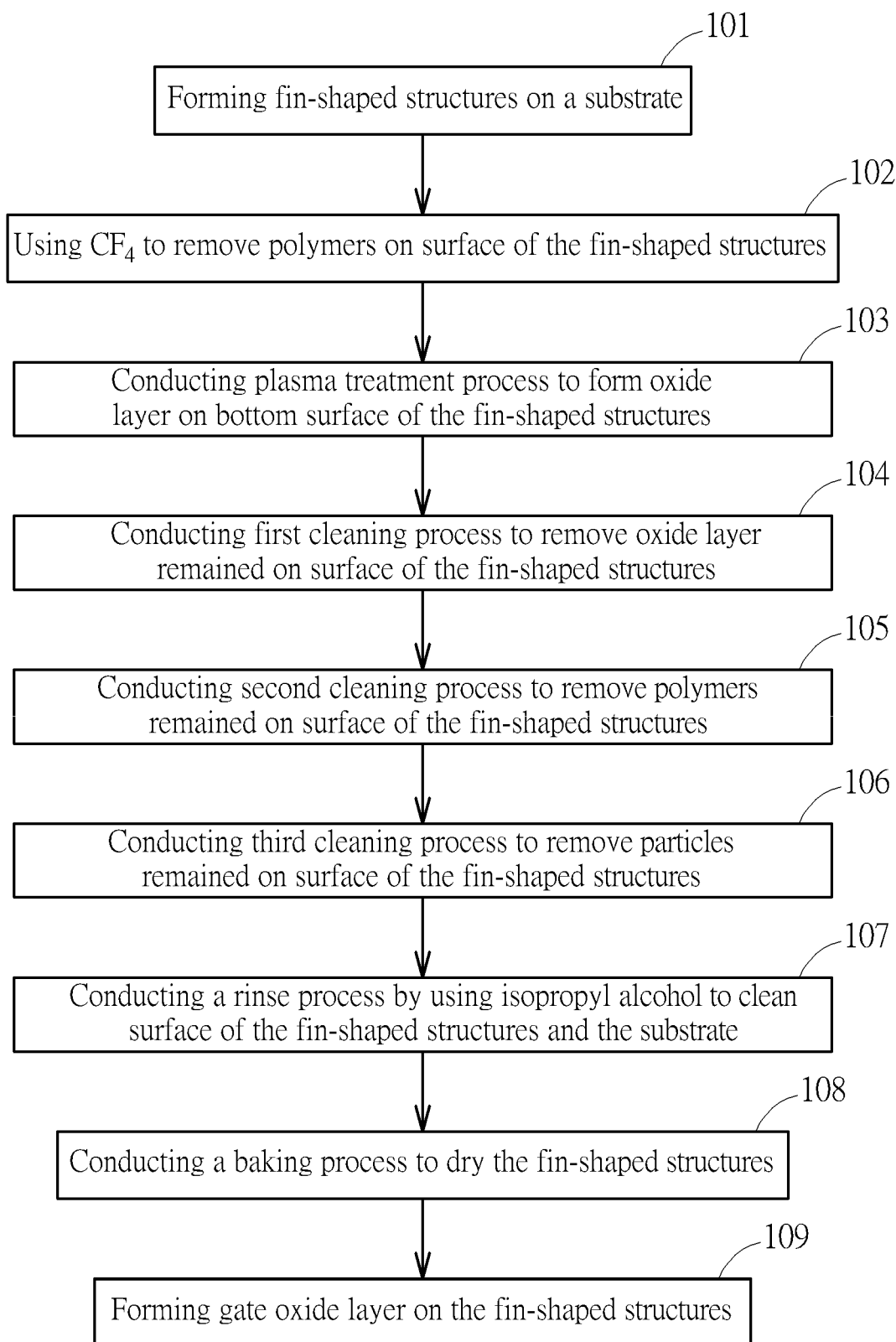
FIG. 1 illustrates a flow chart for fabricating a semiconductor device according to an embodiment of the present invention.
Figure 2:
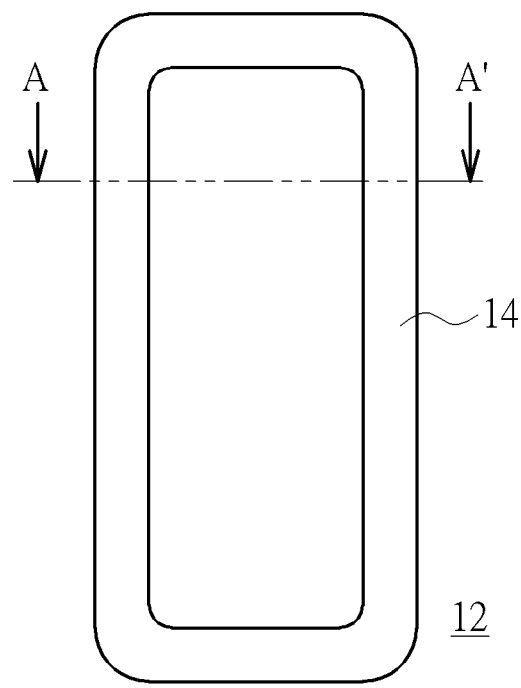
FIG. 2 illustrates a top view for fabricating the semiconductor device according to an embodiment of the present invention.
Figure 3:
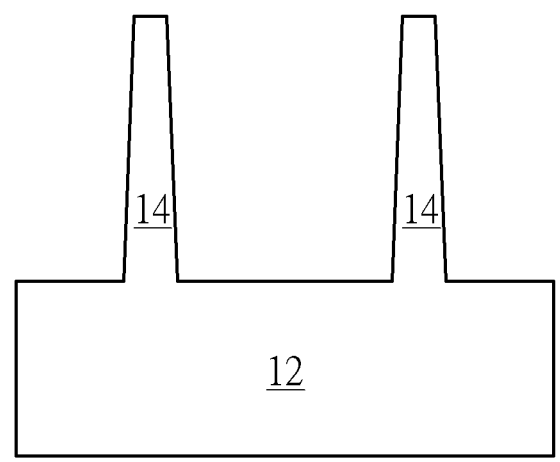
FIGS. 3-4 illustrate cross-section views for fabricating the semiconductor device along the sectional line AA' shown in FIG. 2.
Figure 4:
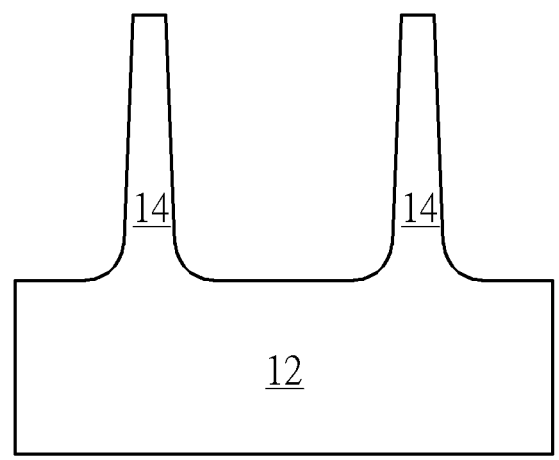
Figure 5:
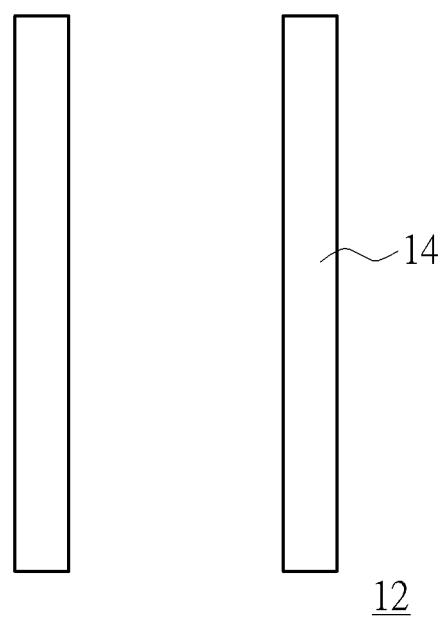
FIG. 5 illustrates a top view for fabricating the semiconductor device according to an embodiment of the present invention.

Referring to FIGS. 1-5, FIG. 1 illustrates a flow chart for fabricating a semiconductor device according to an embodiment of the present invention and FIGS. 2-5 illustrate a method for fabricating the semiconductor device according to an embodiment of the present invention, in which FIG. 2 and FIG. 5 illustrate top views for fabricating the semiconductor device while FIGS. 3-4 illustrate cross-section views for fabricating the semiconductor device along the sectional line AA' shown in FIG. 2. As shown in FIGS. 1-3, a substrate 12 such as a silicon substrate or silicon-on-insulator (SOI) substrate is provided, and fin-shaped structures 14 are formed on the substrate 12 according to step 101. Preferably, the fin-shaped structures 14 formed at this stage include a ring-shape if viewed from a top view perspective as shown in FIG. 2. Moreover, if viewed from a cross-section perspective as shown in FIG. 3, the angles between the fin-shaped structures 14 and the top surface of the substrate 12 are preferably right angles made of planar or straight lines at this stage, or more specifically the angles included by the top surface of the substrate 12 and sidewalls of the fin-shaped structures 14 are made of planar or non-curvy vertical and planar horizontal surfaces having no curvatures.

In addition, the fin-shaped structures 14 of this embodiment are preferably obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the underneath substrate. In this embodiment, it would be desirable to repeat the aforementioned SIT process of transferring patterns to the substrate at least two times or more and such approach typically referred to as self-align double patterning (SADP) would form at least a ring-shaped structure on the substrate.

Alternatively, the fin-shaped structures 14 of this embodiment could also be obtained by first forming a patterned mask (not shown) on the substrate, 12, and through an etching process, the pattern of the patterned mask is transferred to the substrate 12 to form the fin-shaped structure. Moreover, the formation of the fin-shaped structures 14 could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structures 14. These approaches for forming the fin-shaped structures 14 are all within the scope of the present invention.

After the fin-shaped structures 14 are formed, a flush process is conducted by using carbon tetrafluoride ($CF_4$) to remove polymers on surface of the fin-shaped structures 14 according to step 102, and then a plasma treatment process is conducted to form an oxide layer on a bottom surface of the fin-shaped structures 14 near the surface of the substrate 12 according to step 103. Specifically, the plasma treatment process conducted at this stage preferably injects oxygen gas to the bottom portion of the fin-shaped structures 14, in particular the included angles between the fin-shaped structures 14 and the substrate 12 to form an oxide layer made of silicon oxide. According to a preferred embodiment of the present invention, the formation of the oxide layer could facilitate the angles included by the fin-shaped structures 14 and the substrate 12 to alter from angles made of planar surfaces to angles made of curves or curved surfaces in the later process, which could then be used to prevent fin-shaped structures 14 from falling down as a result of reduced pitch size.

In this embodiment, the temperature of the plasma treatment process conducted to form the aforementioned oxide layer is between 135° C. to 165° C. or more specifically at around 150° C., the pressure of the plasma treatment process is between 0.9 Torr to 1.1 Torr or more preferably at around 1 Torr, and the duration of the plasma treatment process is between 2.7 minutes to 3.3 minutes or more preferably at around 3 minutes.

Next, a first cleaning process is conducted to remove the oxide layer remained on the surface of the fin-shaped structures 14 according to step 104. Specifically, as shown in FIG. 4, the first cleaning process conducted at this stage preferably removes the oxide layer formed during the step 103, transforms the angles included between sidewalls of the fin-shaped structures 14 and the top surface of the substrate 12 from angles made of planar surfaces to angles made of curved surfaces, and at the same time removes majority of impurities remained on the surface of the substrate 12 and/or fin-shaped structures 14. In this embodiment, the cleaning agent used in the first cleaning process preferably includes but not limited to for example diluted hydrofluoric acid (dHF).

Next, a second cleaning process is conducted according to step 105 to remove polymers remained on surface of the fin-shaped structures. In this embodiment, the cleaning agent used in the second cleaning process preferably includes but not limited to for example ozone ($O_3$).

Next, a third cleaning process is conducted according to step 106 to remove particles remained on the surface of the fin-shaped structures. In this embodiment, the cleaning agent used in the third cleaning process preferably includes but not limited to for example Standard Clean 1 (SC1).

Next, a rinse process is conducted according to step 107 by using isopropyl alcohol (IPA) to clean the surface of the fin-shaped structures 14 and substrate 12, and a baking process is conducted immediately afterwards according to step 108 to dry the fin-shaped structures 14. It should be noted that in conventional art, a spin dry process is often conducted to dry the fin-shaped structures 14 after the aforementioned third cleaning process of using SC1 to clean the fin-shaped structures 14 is completed. Nevertheless, the approach of combining SC1 along with spin dry process typically induces higher viscosity and causes the fin-shaped structures 14 to fall down. To improve this drawback the present invention first uses isopropyl alcohol to clean the fin-shaped structures 14 and then conducts a baking process to dry the fin-shaped structures 14 thereafter. Since this approach could dry the fin-shaped structures 14 under low viscosity environment it would be desirable to prevent fin-shaped structures 14 from falling down.

In this embodiment, the temperature of the rinse process is preferably at around room temperature, the duration of the rinse process is between 15 seconds to 60 seconds, the temperature of the baking process is between 50° C. to 100° C., and the duration of the baking process is between 5 seconds to 120 seconds.

Next, an in-situ steam generation (ISSG) process is conducted according to step 109 to form a gate oxide layer on the fin-shaped structures 14. It should be noted that the fin-shaped structures at this stage still prevent a ring-shaped overview if viewed from the top. Next, as shown in FIG. 5, a fin cut process could be conducted to separate the ring-shaped fin-shaped structures 14 into a plurality of rectangular fin-shaped structures. It should further be noted that even though only a single ring-shaped fin-shaped structure is separated into two independent rectangular fin-shaped structures in this embodiment, according to other embodiments of the present invention, it would also be desirable to adjust the quantity of fin-shaped structures depending on the demand of the product. Next, typical process used to form standard MOS transistors could be conducted by forming shallow trench isolation (STI) around the fin-shaped structures, forming gate structures on and across the fin-shaped structures, forming spacers around the gate structures, and forming source/drain regions adjacent to two sides of the gate structures. This completes the fabrication of semiconductor device according to an embodiment of the present invention.

Overall, since current fin-shaped structures fabricated through aforementioned self-align double patterning (SADP) process typically involves going through a series of cleaning process, reduces the pitches of the fin-shaped structures, and ultimately causes the fin-shaped structures to fall, the present invention preferably introduces two approaches into the cleaning process to improve this issue.

First, the present invention uses $CF_4$ to remove polymers on the surface of the fin-shaped structures and then conducts an $O_2$ plasma process to form an oxide layer on the bottom of the fin-shaped structures as well as the corners included by the fin-shaped structures 14 and the substrate 12. By doing so the first cleaning process conducted thereafter would be able to remove the oxide layer and alter the angles included by the fin-shaped structure 14 and the substrate 12 from angles made by planar surfaces to angles having curved surfaces. Moreover the present invention uses isopropyl alcohol (IPA) to rinse the fin-shaped structures after the aforementioned first cleaning process, second cleaning process, and third cleaning process were completed, conducts a baking process to dry the fin-shaped structures, and then conducts a fin cut process to separate the ring-shaped fin-shaped structure into a plurality of rectangular fin-shaped structures. By inserting the above two approaches into a series of cleaning processes conducted in current fin-shaped structure fabrication process, the present invention is able to prevent fin-shaped structure from falling down as pitch reduces.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   forming a ring-shaped fin-shaped structure on a substrate;
   performing a plasma treatment process to form an oxide layer on a bottom portion of the ring-shaped fin-shaped structure;
   performing a first cleaning process to remove the oxide layer;
   using isopropyl alcohol (IPA) to perform a rinse process on the ring-shaped fin-shaped structure and the substrate;
   performing a baking process; and
   forming a gate oxide layer on the ring-shaped fin-shaped structure after performing the baking process,
   performing a fin cut process to cut the ring-shaped fin-shaped structure after forming the gate oxide layer to form a plurality of fin-shaped structures.

2. The method of claim 1, further comprising:
   performing a second cleaning process to remove polymers remaining on a surface of the ring-shaped fin-shaped structure after the first cleaning process; and
   performing a third cleaning process to remove particles remaining on the surface of the ring-shaped fin-shaped structure after the second cleaning process.

3. The method of claim 2, further comprising using oxygen gas ($O_2$) to perform the plasma treatment process.

4. The method of claim 3, wherein a temperature of the plasma treatment process is between 135° C. to 165° C.

5. The method of claim 3, wherein a pressure of the plasma treatment process is between 0.9 Torr to 1.1 Torr.

6. The method of claim 3, wherein a duration of the plasma treatment process is between 2.7 minutes to 3.3 minutes.

7. The method of claim 2, further comprising using diluted hydrofluoric acid (dHF) to perform the first cleaning process.

8. The method of claim 2, further comprising using ozone ($O_3$) to perform the second cleaning process.

9. The method of claim 2, further comprising using Standard Clean 1 (SC1) to perform the third cleaning process.

10. The method of claim 1, wherein a duration of the rinse process is between 15 seconds to 60 seconds.

11. The method of claim 1, wherein a temperature of the baking process is between 50° C. to 100° C.

12. The method of claim 1, wherein a duration of the baking process is between 5 seconds to 120 seconds.

13. The method of claim 1, further comprising performing an in-situ steam generation (ISSG) process to form the gate oxide layer.

* * * * *